(12) United States Patent
Srivastava et al.

(10) Patent No.: US 10,826,469 B2
(45) Date of Patent: Nov. 3, 2020

(54) HIGH PERFORMANCE AND LOW POWER TSPC LATCH WITH DATA AGNOSTIC SETUP AND HOLD TIME

(71) Applicant: Synopsys, Inc., Mountain View, CA (US)

(72) Inventors: Manish Srivastava, Bangalore (IN); Pradip Subhana Jadhav, Thane (IN)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 16/795,456

(22) Filed: Feb. 19, 2020

(65) Prior Publication Data

US 2020/0274525 A1 Aug. 27, 2020

(30) Foreign Application Priority Data

Feb. 21, 2019 (IN) .......................... IN201911006931

(51) Int. Cl.
*H03K 3/356* (2006.01)
*H03K 3/012* (2006.01)

(52) U.S. Cl.
CPC ....... *H03K 3/356165* (2013.01); *H03K 3/012* (2013.01)

(58) Field of Classification Search
CPC .......................... H03K 3/356165; H03K 3/012
USPC ......................................................... 327/211
See application file for complete search history.

(56) References Cited

U.S. PATENT DOCUMENTS

| | | | |
|---|---|---|---|
| 6,069,495 A | 5/2000 | Ciccone et al. | |
| 6,301,318 B1 | 10/2001 | Wei et al. | |
| 7,696,972 B2 | 4/2010 | Tseng et al. | |
| 8,604,854 B1* | 12/2013 | Partovi | H03K 3/356113 327/199 |
| 2005/0242861 A1* | 11/2005 | Kanda | H03K 3/356113 327/218 |
| 2006/0082405 A1* | 4/2006 | Chatterjee | H03K 3/356121 327/218 |
| 2007/0146034 A1* | 6/2007 | Acharya | H03K 3/356 327/218 |

(Continued)

OTHER PUBLICATIONS

Yuan, Jiren et al., article entitled "New Single-Clock CMOS Latches and Flipflops with Improved Speed and Power Savings", IEEE Journal of Solid-State Circuits, vol. 32, No. 1, Jan. 1997, 8 pages.

*Primary Examiner* — Metasebia T Retebo
(74) *Attorney, Agent, or Firm* — Bever, Hoffman & Harms, LLP

(57) ABSTRACT

A True Single Phase Clock (TSPC) latch design with symmetrical input data paths. A first input data path includes: a first NMOS transistor coupling a gate of a first PMOS transistor to VSS in response to a rising input data signal, and a second PMOS transistor having a gate coupled to a logic low (VSS) input clock signal, whereby the first and second PMOS transistors turn on to couple a data input node to VDD. A second input data path includes: a third PMOS transistor having a gate coupled to a falling input data signal (VSS), a fourth PMOS transistor having a gate coupled to a logic low (VSS) input clock signal, whereby the third and fourth PMOS transistors turn on to couple a gate of a second NMOS transistor to VDD, whereby the second NMOS transistor turns on to couple the data input node to VSS.

13 Claims, 10 Drawing Sheets

(56) References Cited

U.S. PATENT DOCUMENTS

| | | | |
|---|---|---|---|
| 2009/0219068 A1* | 9/2009 | Mizuhashi | H03L 7/089 327/158 |
| 2010/0052738 A1* | 3/2010 | Won | H03K 23/54 327/117 |
| 2010/0219873 A1* | 9/2010 | Chang | H03K 19/018528 327/333 |
| 2011/0254605 A1* | 10/2011 | Lin | H03K 23/667 327/218 |

* cited by examiner

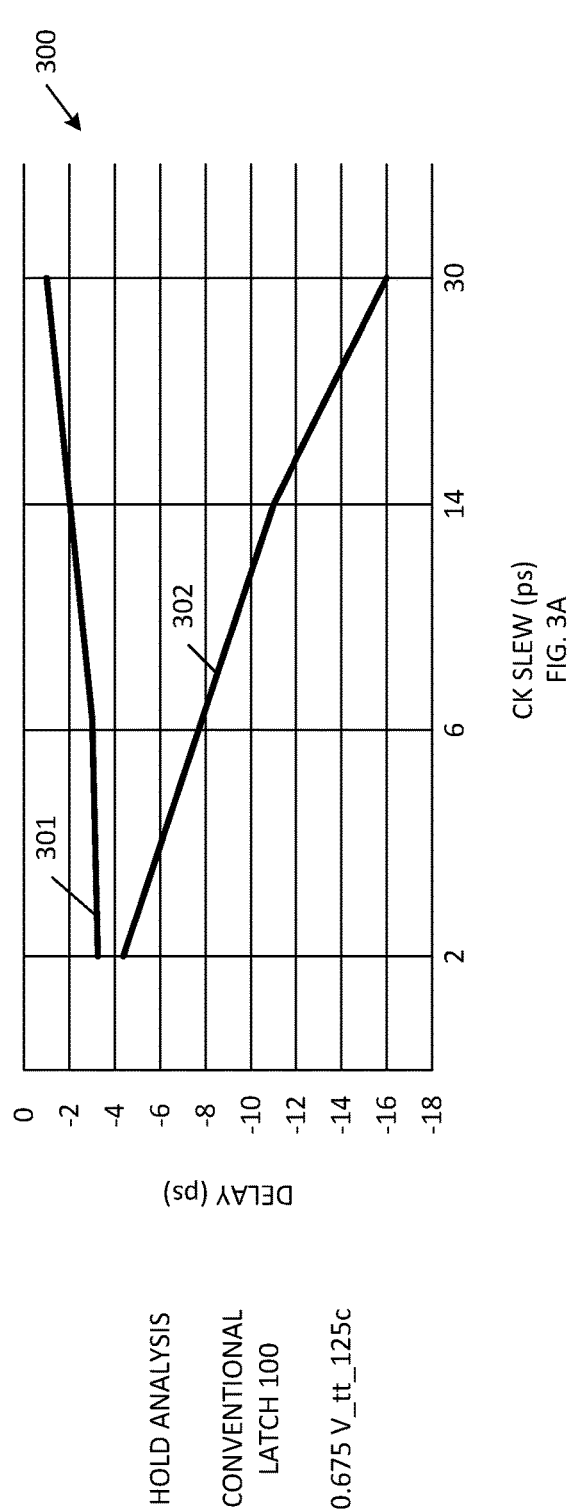
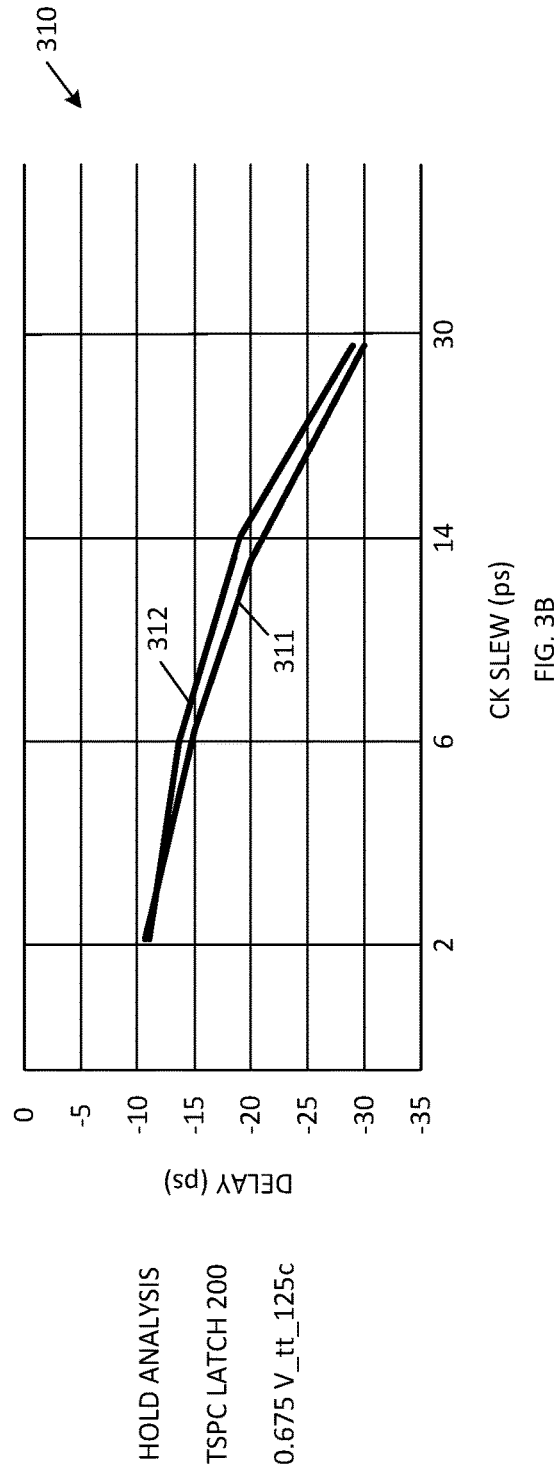

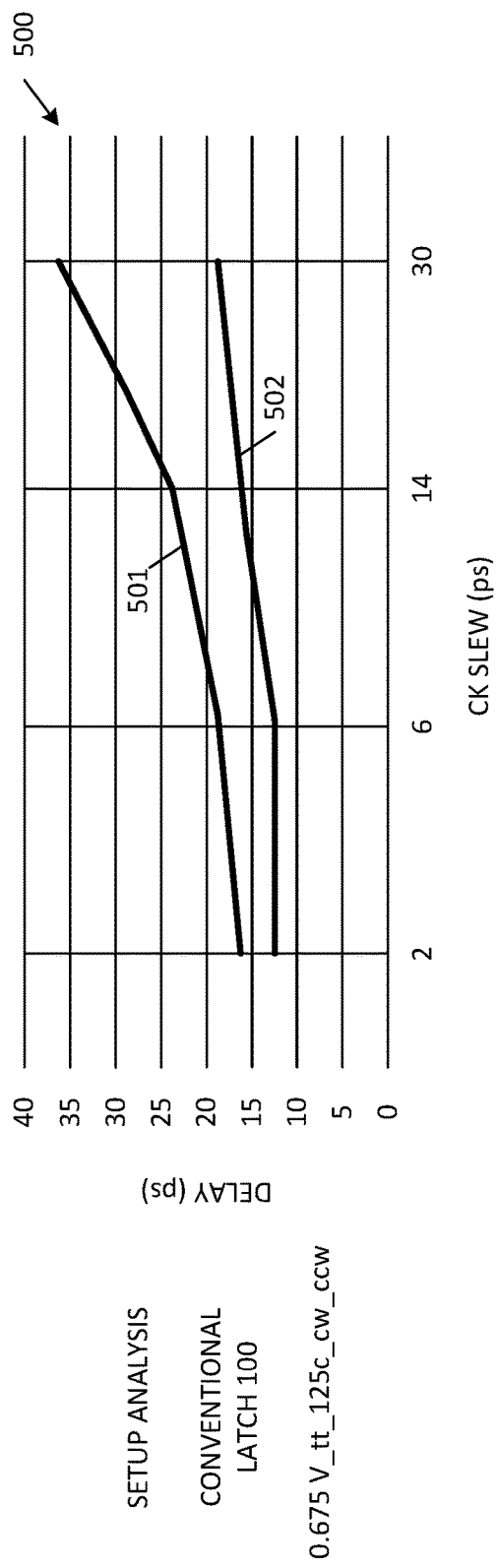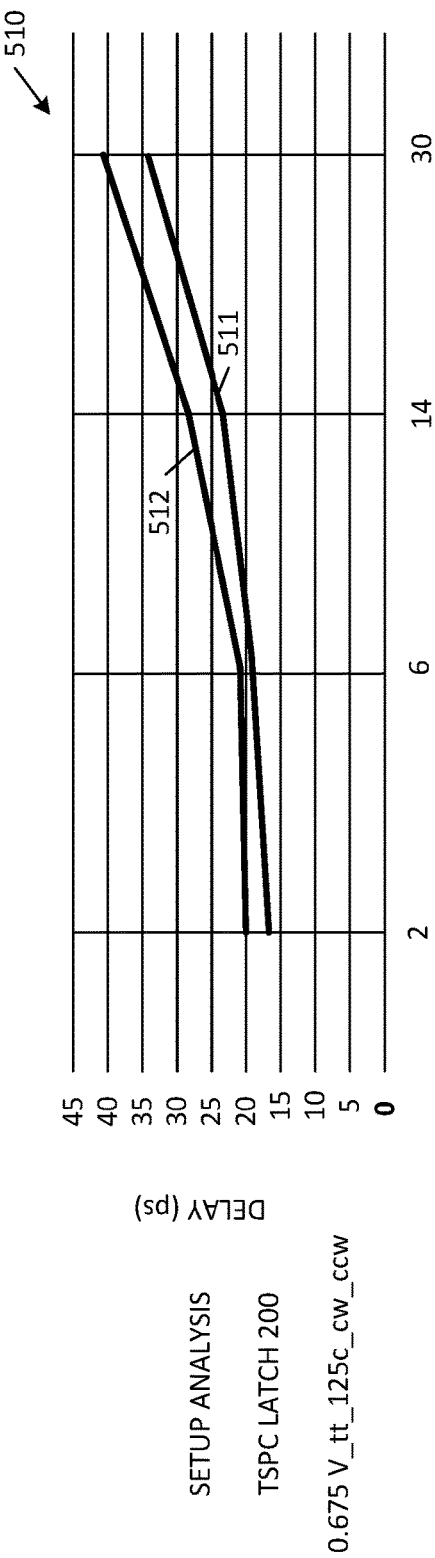

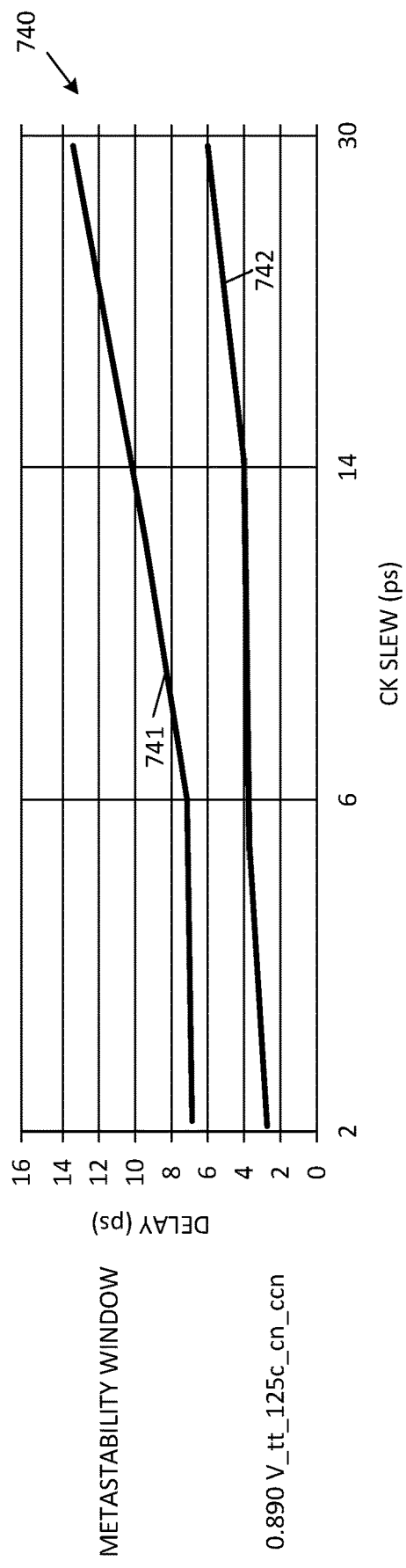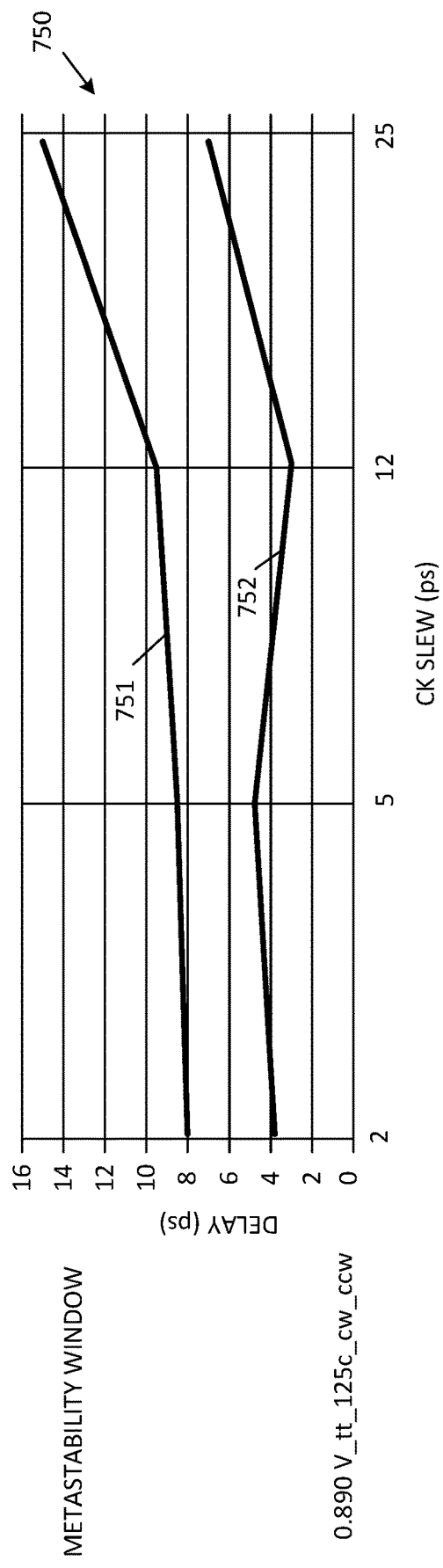
FIG. 7E
FIG. 7F

HIGH PERFORMANCE AND LOW POWER TSPC LATCH WITH DATA AGNOSTIC SETUP AND HOLD TIME

COPYRIGHT NOTICE

The assignee of this patent document has no objection to the facsimile reproduction by anyone of the patent document itself, or of the patent application, as it appears in the files of the United States Patent and Trademark Office, but otherwise reserves all rights whatsoever in any included works of authorship protected by copyright.

SPECIFICATION—DISCLAIMER

In the following Background, Summary, and Detailed Description, headings should not be construed as necessarily limiting. In the following Background, Summary and Detailed Description, the citation or identification of any publication does not signify relevance or status as prior art for any of the claimed or described embodiments. Paragraphs for which the text is all italicized signifies text that is common to multiple patent specifications filed by the assignee of this invention.

RELATED APPLICATION

This U.S. non-provisional patent application claims priority to Indian Provisional Application Number IN201911006931 filed Feb. 21, 2019.

FIELD OF THE INVENTION

The present invention relates to a true single-phase clock (TSPC) latch.

RELATED ART

FIG. 1 is a circuit diagram of a conventional latch 100, which includes PMOS transistors 111-117 and NMOS transistors 121-127. These transistors are configured as illustrated to form data input circuit 101, data latch circuit 102, output buffer 103 and clock inverter 110.

Latch 100 operates in response to input clock signal CK and complementary clock signal CKL, wherein the input clock signal CK is applied to the gates of PMOS transistor 117 and NMOS transistor 127, which are connected as an inverter 110. Inverter 110 provides the complementary clock signal CKL in response to the input clock signal CK. Generating the complementary clock signal CKL in this manner undesirably introduces skew between the rising and falling edges of the clock signal CK and CKL.

PMOS transistors 111-112 and NMOS transistors 121-122 are connected to form data input circuit 101, wherein the gates of transistors 111 and 121 are coupled to receive a data input signal (D), and the gates of transistors 112 and 122 are coupled to receive the input clock signal CK and the complementary clock signal CKL, respectively. If the input data signal D has a logic low state, PMOS transistor 111 will turn on (and NMOS transistor 121 will turn off). When the clock signal CK transitions to a logic low state, PMOS transistor 112 will also turn on, such that the output data signal D_BUFF of the data input circuit 101 is pulled up to the VDD supply voltage through PMOS transistors 111 and 112, which form a first input data path 151.

If the input data signal D has a logic high state, NMOS transistor 121 will turn on (and PMOS transistor 111 will turn off). When the clock signal CKL transitions to a logic high state, NMOS transistor 122 will also turn on, such that the output data signal D_BUFF of the data input circuit 101 is pulled down to the VSS supply voltage through NMOS transistors 121 and 122, which form a second input data path 152.

Because the first input data path 151 and the second input data path 152 are formed of different types of transistors (i.e., the first input data path 151 is formed of PMOS transistors 111-112, and the second input data path 152 is formed on NMOS transistors 121-122), the latch 100 has asymmetrical input data paths for rising and falling data signals, which undesirably results in asymmetrical setup/hold rise and fall times. The clock signal skew and the asymmetrical setup/hold rise and fall times in the design undesirably worsen the metastability of latch 100.

PMOS transistors 113-115 and NMOS transistors 123-125 form data latch circuit 102, which latches the output data signal D_BUFF when the clock signal CK transitions to a logic high state, and the complementary clock signal CKL transitions to a logic low state. Note that the gates of transistors 125 and 115 are coupled to receive the CK and CKL clock signals, respectively. Thus, there are six transistors (i.e., transistors 112, 115, 117, 122, 125 and 127) of latch 100 that operate in response to the clock signals CK and CKL. The more transistors coupled to receive the clock signals CK and CKL, the higher the clock power consumption of the latch circuit 100.

It would therefore be desirable to have an improved latch circuit that does not exhibit the clock skew, asymmetrical setup/hold rise and fall times and clock power consumption of conventional latch circuit 100. It would further be desirable if this improved latch circuit does not require a larger layout area than conventional latch circuit 100.

SUMMARY

This Summary does not attempt to provide the complete significance of any particular innovation, embodiment, or example as it can be used in commerce. Additionally, this Summary is not intended to signify key or critical elements of an innovation, embodiment or example or to limit the scope of the subject matter of this disclosure. The innovations, embodiments, and/or examples found within this disclosure are not all-inclusive, but rather describe the basic significance of the subject matter. Accordingly, one use of this Summary is as a prelude to a Detailed Description presented below.

Accordingly, the present invention provides an improved high-speed True Single-Phase Clock (TSPC) latch circuit which reduces or substantially eliminates the above-described shortcomings and disadvantages of conventional latch 100.

In accordance with various embodiments of the present invention, the improved TSPC latch is characterized by substantial improvement in setup and hold time, along with improvements in metastability, such that data presented on the input of the latch can be changed substantially simultaneously with the input clock signal that latches the input data within the latch. More particularly, the advantages of the latch can be utilized in sense amplifier circuits of memories, sensors, high speed data paths, wherein the transition of a single clock signal can be employed to sense and latch the data read. In one embodiment of the present invention, the high-speed TSPC latch has a balanced symmetrical construction, including symmetric input data paths for data rise and fall, thereby significantly reducing the occurrence of metastable states by providing improvements in clock skew and the setup and hold time windows. The TSPC latch described herein advantageously exhibits the features of: symmetric setup/hold rise and fall (R/F) time, low clock power, no layout area impact, and significant improvement in the metastability window.

In accordance with one embodiment, the present invention provides a True Single Phase Clock (TSPC) latch design with symmetrical input data paths. A first input data path includes a first NMOS transistor that couples a gate of a first PMOS transistor to receive a VSS supply voltage in response to a rising input data signal, and a second PMOS transistor having a gate coupled to a logic low (VSS) input clock signal, whereby the first and second PMOS transistors turn on to couple a data input node to a VDD supply voltage. A second input data path includes: a third PMOS transistor having a gate coupled to a falling input data signal (VSS) and a fourth PMOS transistor having a gate coupled to a logic low (VSS) input clock signal, whereby the third and fourth PMOS transistors turn on to couple a gate of a second NMOS transistor to the VDD supply voltage, whereby the second NMOS transistor turns on to couple the data input node to VSS.

In one embodiment, a third NMOS transistor has a gate coupled to receive the input clock signal, a source coupled to the VSS supply voltage terminal, and a drain coupled to the gates of the first PMOS transistor and the second NMOS transistor. This third NMOS transistor advantageously prevents undefined states on the gates of the first PMOS transistor and the second NMOS transistor In accordance with another embodiment, the data input node is coupled to a data latch circuit and an output inverter. The data latch circuit includes a feedback inverter, which is cross-coupled with a feed-forward inverter. In one embodiment, the feedback inverter is enabled and disabled in response to the input clock signal in a manner that prevents indeterminate states in the data latch circuit.

The present invention will be more fully understood in view of the following description and drawings.

BRIEF DESCRIPTION OF THE DRAWINGS

The following Detailed Description, Figures, appended Additional Figures and appended Claims signify the nature and advantages of the innovations, embodiments and/or examples of the claimed inventions. All of the Figures signify innovations, embodiments, and/or examples of the claimed inventions for purposes of illustration only and do not limit the scope of the claimed inventions. Such Figures are not necessarily drawn to scale, and are part of the Disclosure.

In the Figures, similar components or features may have the same, or similar, reference signs in the form of labels (such as alphanumeric symbols, e.g., reference numerals), and may signify similar or equivalent functionality. A brief description of the Figures is below.

FIG. 3A is a graph illustrating a hold time analysis of the conventional latch of FIG. 1 for an exemplary set of process parameters (tt), VDD supply voltage (0.675 Volts) and temperature (125° C.).

FIG. 3B is a graph illustrating a hold time analysis of the TSPC latch of FIG. 2 for an exemplary set of process parameters (tt), VDD supply voltage (0.675 Volts) and temperature (125° C.).

FIG. 5A is a graph illustrating a setup time analysis of the conventional latch of FIG. 1 for an exemplary set of process parameters (tt, cw_ccw), VDD supply voltage (0.675 Volts) and temperature (125° C.)

FIG. 5B is a graph illustrating a hold time analysis of the TSPC latch of FIG. 2 for an exemplary set of process parameters (tt, cw_ccw), VDD supply voltage (0.675 Volts) and temperature (125° C.)

FIG. 7E is a graph of the metastability windows for the conventional latch of FIG. 1 and the TSPC latch of FIG. 2 for an exemplary set of process parameters (tt, cn_ccn), VDD supply voltage (0.890 Volts) and temperature (125° C.)

FIG. 7F is a graph of the metastability windows for the conventional latch of FIG. 1 and the TSPC latch of FIG. 2 for an exemplary set of process parameters (tt, cw_ccw), VDD supply voltage (0.890 Volts) and temperature (125° C.)

Figure 1:
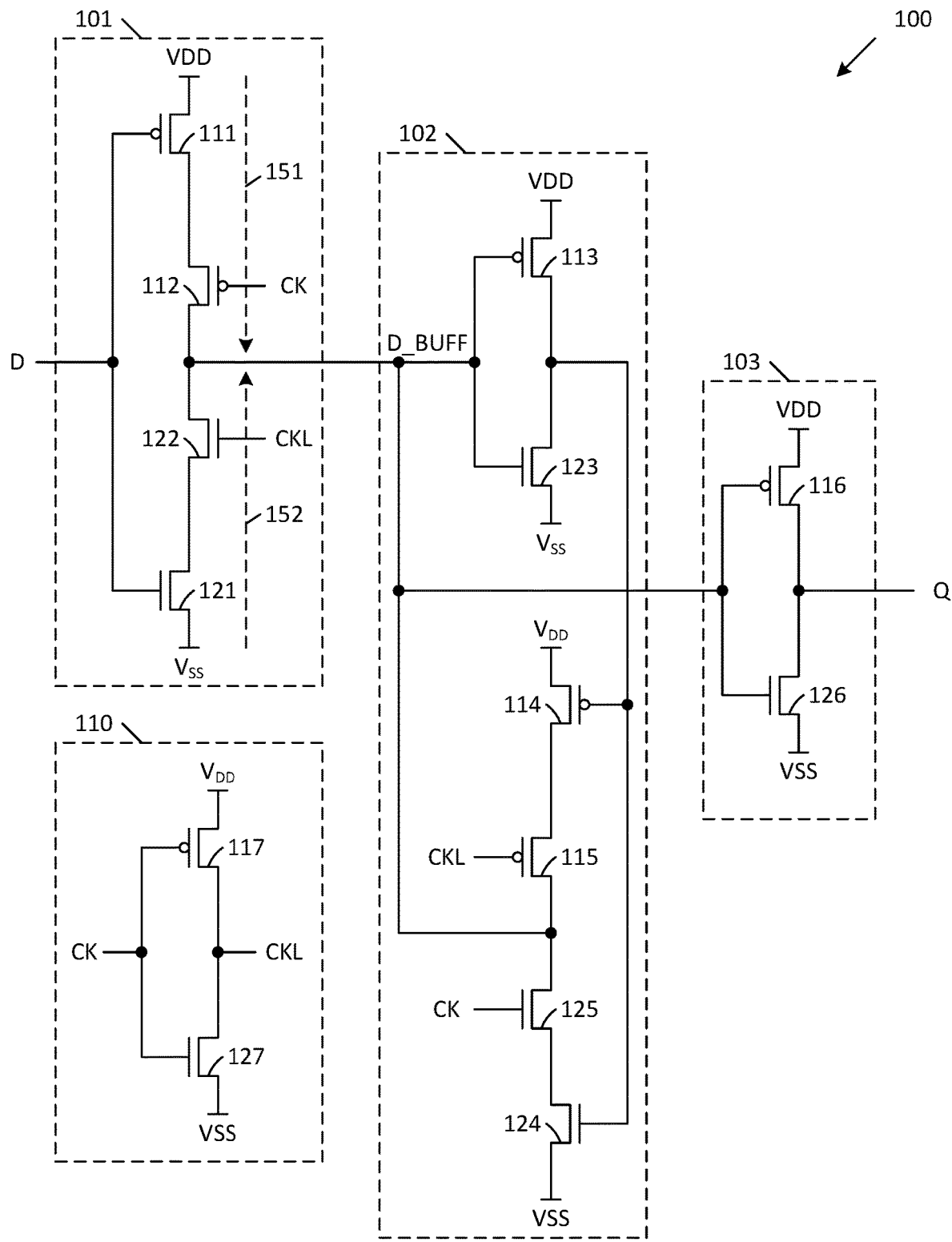
FIG. 1 is a circuit diagram of a conventional latch.

In such various figures, reference signs may be omitted as is consistent with accepted engineering practice; however, one of ordinary skill in the art will understand that the illustrated components are readily understood when viewed in context of the illustration as a whole and the accompanying disclosure describing such various figures.

DETAILED DESCRIPTION

The Figures and the following Detailed Description signify innovations, embodiments and/or examples by way of illustration only, with various features, structures or characteristics described together in a single embodiment to streamline the disclosure. Variations of any of the elements, processes, machines, systems, manufactures or compositions disclosed by such exemplary innovations, embodiments and/or examples will be readily recognized and may be used in commerce without departing from the principles of what is claimed. The Figures and Detailed Description may also signify, implicitly or explicitly, advantages and improvements of a subset of the exemplary embodiments described herein.

In the Figures and Detailed Description, numerous specific details may be described to provide a thorough understanding of one or more of the exemplary innovations, embodiments and/or examples. In the interest of not obscuring the presentation of the exemplary innovations, embodiments and/or examples in the following Detailed Description, some processing steps or operations that are known in the art may have been combined together for presentation and for illustration purposes and might not be described in detail. However, a person skilled in the art will recognize that these exemplary innovations, embodiments and/or examples may be used in commerce without these specific details or with equivalents thereof. In other instances, well-known processes and devices are not described in detail as not to unnecessarily obscure aspects of these exemplary innovations, embodiments and/or examples. In other instances, some processing steps or operations that are known in the art may not be described at all. The following description is instead focused on the distinctive features or elements of various exemplary innovations, embodiments and/or examples. Furthermore, while this description may refer to some components of the structure in the singular tense, more than one component may be depicted throughout the Figures and like components are labeled with like numerals.

The class of logic circuits known as True Single-Phase Clock (TSPC) logic circuits has gained considerable favor in recent years by offering advantages in many applications in speed and power dissipation when compared with many conventional circuit techniques. TSPC circuits have provided increased flexibility in designs while maintaining speed and power advantages.

The present invention relates to a TSPC latch design that operates with a data agnostic setup and hold time. The TSPC latch of the present invention advantageously enables data to be captured more accurately (i.e., data capture is less sensitive to the data transition level than in conventional latch 100), and also enables high speed operation with low power consumption. The proposed design has better symmetry between setup/hold rise time and fall time, and an improved metastability window. In accordance with one embodiment, a TSPC latch in accordance with the present invention is implemented in a system on a chip (SOC) design.

Figure 2:
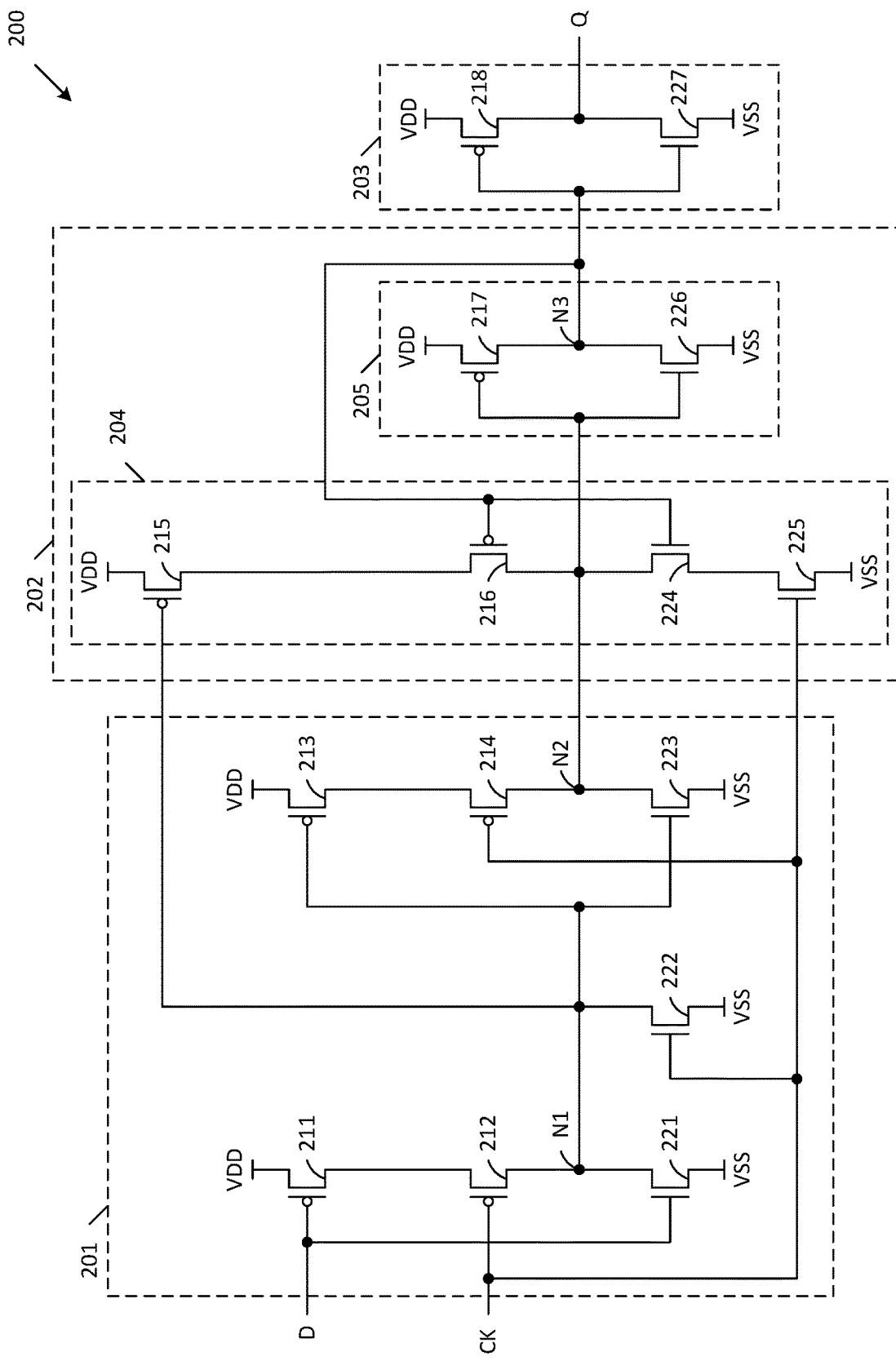
FIG. 2 is a circuit diagram of an improved true single phase clock (TSPC) latch in accordance with one embodiment of the present invention.

FIG. 2 is a circuit diagram of a TSPC latch 200 in accordance with one embodiment of the present invention. TSPC latch 200 includes PMOS transistors 211-218 and NMOS transistors 221-227. These transistors are configured as illustrated to form data input circuit 201, data latch circuit 202 (which includes feed-back inverter 204 and feed-forward inverter 205) and output buffer 203. As described in more detail below, TSPC latch 200 operates in response to a single clock signal phase (CK), and therefore does not require the clock inverter 110 of conventional latch 100.

Data input circuit 201 includes a first set of three transistors, including PMOS transistors 211-212 and NMOS transistor 221, which are coupled in series between the VDD voltage supply terminal and the VSS voltage supply terminal as illustrated. In one embodiment, the VDD voltage supply terminal is coupled to receive a positive supply voltage (e.g., 0.9 Volts), and the VSS voltage supply terminal is coupled to ground (0 Volts). As described in more detail below, latch 200 is capable of operating over a wide range of VDD supply voltages. An input data signal D is applied to the gates of PMOS transistor 211 and NMOS transistor 221. The input clock signal CK is applied to the gate of PMOS transistor 212. The drains of transistors 212 and 221 are commonly coupled to internal node N1.

The drain of NMOS transistor 222 is coupled to internal node N1, the source of NMOS transistor 222 is coupled to VSS voltage supply terminal, and the gate of NMOS transistor 222 is coupled to receive the input clock signal CK. As described in more detail below, NMOS transistor 222 prevents an undefined state on internal node N1 when the clock signal CK has a logic high state (CK=1) and the input data signal D has a logic low state (D=0).

Data input circuit 201 also includes a second set of three transistors, including PMOS transistors 213-214 and NMOS transistor 223, which are coupled in series between the VDD voltage supply terminal and the VSS voltage supply terminal as illustrated. The gates of PMOS transistor 213 and NMOS transistor 223 are commonly coupled to internal node N1, and the gate of PMOS transistor 214 is coupled to receive the input clock signal CK. The drains of PMOS transistor 214 and NMOS transistor 223 are commonly coupled to data buffer node N2. As described in more detail below, data input circuit 201 transmits the input data signal D to data buffer node N2 along symmetric input data paths in response to the input clock signal CK.

Within data latch circuit 202, feedback inverter 204 includes PMOS transistors 215-216, which are coupled in series between the VDD voltage supply terminal and data buffer node N2, and NMOS transistors 224-225, which are coupled in series between data buffer node N2 and the VSS voltage supply terminal. The data buffer node N2 forms an output terminal of feedback inverter 204. The gate of PMOS transistor 215 is coupled to internal node N1, and the gate of NMOS transistor 225 is coupled to receive the input clock signal CK. The gates of PMOS transistor 216 and NMOS transistor 224 are commonly coupled to form an input terminal of feedback inverter 204.

Data latch circuit 202 also includes feed-forward inverter 205, which includes PMOS transistor 217 and NMOS transistor 226. The gates of PMOS transistor 217 and NMOS transistor 226 are commonly coupled to form the input terminal of feed-forward inverter 205, which is coupled to data buffer node N2. The output terminal of feed-forward inverter 205 (i.e., node N3) is coupled to the input terminal of feedback inverter 204. The output terminal of feed-forward inverter 205 is also coupled to the input terminal of output buffer 203. Note that output buffer 203 includes PMOS transistor 218 and NMOS transistor 227, which are configured to form an inverter circuit, wherein the output terminal of this inverter circuit provides the output data signal Q.

As described in more detail below, data latch circuit 202 latches the data signals on data buffer node N2 in response to the input clock signal CK. More specifically, the rising edge of the input clock signal causes PMOS transistor 215 and NMOS transistor 225 to turn on, thereby enabling the feedback inverter 204 in data latch circuit 202. When the feedback inverter 204 is enabled, the data value on data buffer node N2 is latched by feedback inverter 204 and feed-forward inverter 205.

The operation of TSPC latch 200 will now be described. When the input clock signal CK has a logic low state (CK=VSS), the input data signal D is driven onto the data buffer node N2. The logic low state of the input clock signal CK turns on PMOS transistors 212 and 214, and turns off NMOS transistors 222 and 225. When the input data signal D is rising to a logic high state (D VDD), NMOS transistor 221 turns on, thereby pulling internal node N1 down to a logic low state (N1→VSS). In response, PMOS transistor 213 turns on. Under these conditions, data buffer node N2 is pulled up to a logic high state (N2→VDD) through turned on PMOS transistors 213 and 214. Thus, for a rising input data signal D, the input data path to data buffer node N2 includes turned on NMOS transistor 221, followed by two turned on stacked PMOS transistors 213 and 214.

Conversely, when the input clock signal CK has a logic low state and the input data signal D is falling to a logic low state (D VSS), PMOS transistor 211 turns on. Under these conditions, internal node N1 is pulled up to a logic high state (N1→VDD) through turned on PMOS transistors 211 and 212. In response to the logic high state of internal node N1, NMOS transistor 223 turns on, thereby pulling data buffer node N2 down to a logic low state (N2→VSS). Thus, for a falling input data signal D, the input data path to data buffer node N2 includes two turned on stacked PMOS transistors 211 and 212, followed by turned on NMOS transistor 223.

Because the input data path to data buffer node N2 for a rising input data signal D and the input data path to data buffer node N2 for a falling input data signal D each include one turned on NMOS transistor and two turned on stacked PMOS transistors, the input data paths to data buffer node N2 are substantially symmetrical for rising and falling input data signals. These symmetrical input data paths advantageously minimize the skew between the required setup times for rising and falling input data signals. That is, the required setup time for rising input data signals is substantially the same as the required setup time for falling input data signals, due to the symmetrical input data paths for rising and falling input data signals. Similarly, these symmetrical input data paths advantageously minimize the skew between the required hold times for rising and falling input data signals.

When the input clock signal CK transitions to a logic high state (CK→VDD), the input data value on data buffer node N2 is latched within data latch circuit 202. More specifically, the logic high state of the input clock signal CK turns on NMOS transistors 222 and 225. Note that turning on NMOS transistor 222 advantageously avoids an undefined logic state on internal node N1 when the input clock signal CK transitions to a logic high state. When NMOS transistor 222 turns on, the gate of PMOS transistor 215 is pulled down to a logic low state (VSS), thereby turning on PMOS transistor 215. Feedback inverter 204 is enabled by turning on PMOS transistor 215 and NMOS transistor 225.

If the input data signal D has a logic low state when the input clock signal CK transitions to a logic high state, then data buffer node N2 is initially held at a logic low state (N2=VSS), in the manner described above. Under these conditions, the feed-forward inverter 205 provides a voltage having a logic high state on node N3 (N3=VDD). The logic high state of node N3 turns on NMOS transistor 224 (and turns off PMOS transistor 216) of feedback inverter 204. As a result, data buffer node N2 is held (latched) at a logic low state (N2=VSS) by turned on NMOS transistors 224 and 225, which couple data buffer node N2 to the VSS voltage supply terminal. Under these conditions, the output buffer 203 provides an output data signal Q having a logic low state (Q=VSS).

Conversely, if the input data signal D has a logic high state when the input clock signal transitions to a logic high state, then data buffer node N2 is initially held at a logic high state (N2=VDD), in the manner described above. Under these conditions, the feed-forward inverter 205 provides a voltage having a logic low state on node N3 (N3=VSS). The logic low state of node N3 turns on PMOS transistor 216 (and turns off NMOS transistor 224). As a result, data buffer node N2 is held (latched) at a logic high state (N2=VDD) by turned on PMOS transistors 215 and 216, which couple data buffer node N2 to the VDD voltage supply terminal. Under these conditions, the output buffer 203 provides an output data signal Q having a logic high state (Q=VDD).

In the manner described above, TSPC latch 200 advantageously operates in response to a single input clock signal CK (i.e., a single input clock phase), thereby eliminating clock skew issues which may arise from the use of multiple clock phases (such as the use of the CK and CKL clock signals in conventional latch 100).

In the manner described above, the design of TSPC latch 200 includes only four gated clock devices (i.e., PMOS transistors 212 and 214, and NMOS transistors 222 and 225), which advantageously reduces the capacitance of TSPC latch 200 on the associated clock network (when compared with conventional latch 100, which includes six gated clock devices (i.e., transistors 112, 115, 117, 122, 125 and 127). Due to this reduced capacitance, clock power requirements associated with TSPC 200 are significantly reduced with respect to conventional latch 100. In accordance with one set of simulations (process=ffg, VDD=0.9 Volts, and temperature=125° C.), the average VDD current of the conventional latch 100 is about 58.2 μAmps, while the average VDD current of the TSPC latch 200 of the present invention is about 39 μAmps.

Simulations performed using a post-layout Extracted Resistance and Capacitance (R/C) netlist for conventional latch 100 and TSPC latch 200 provide the results illustrated in FIGS. 3A-3B, 4A-4B, 5A-5B, 6A-6B and 7A-7F.

More specifically, FIG. 3A is a graph 300 illustrating a hold time analysis of conventional latch 100 at a VDD supply voltage of 0.675 Volts, process parameters 'tt' (which represents a typical process with typical NMOS and PMOS transistors) and a temperature of 125° C. Curve 301 represents the required hold times associated with a falling input data signal D for various clock slew values, and curve 302 represents required hold times associated with a rising input data signal D for various clock slew values.

FIG. 3B is a graph 310 illustrating a hold time analysis of TSPC latch 200 at a VDD supply voltage of 0.675 Volts, process parameters 'tt' and a temperature of 125° C. Curve 311 represents required hold times associated with a falling input data signal D for various clock slew values, and curve 312 represents required hold times associated with a rising input data signal D for various clock slew values.

Figure 4A:
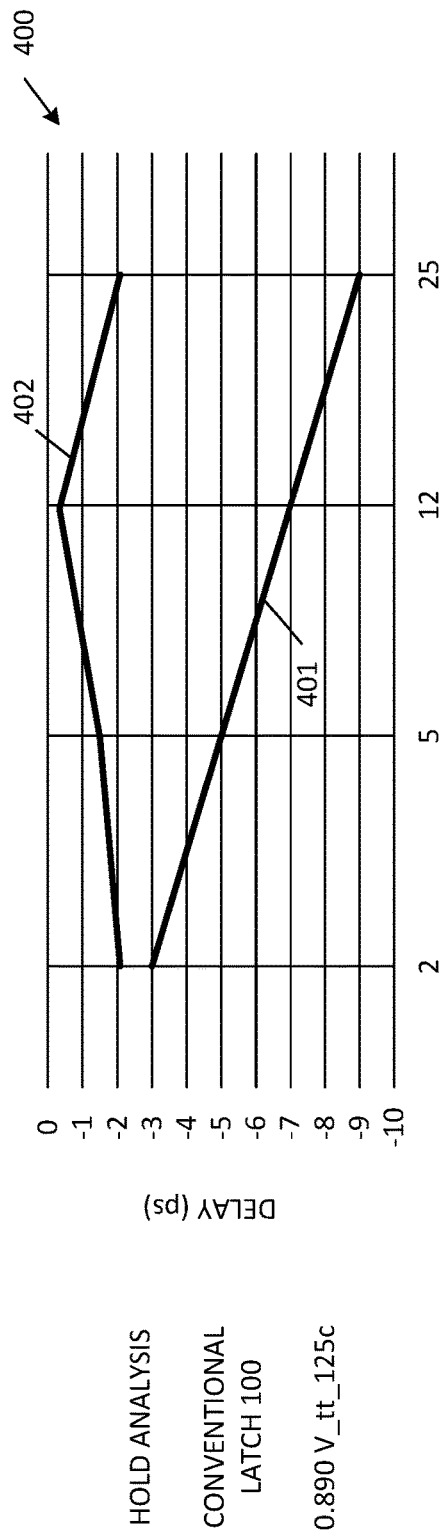
FIG. 4A is a graph illustrating a hold time analysis of the conventional latch of FIG. 1 for an exemplary set of process parameters (tt), VDD supply voltage (0.890 Volts) and temperature (125° C.)

FIG. 4A is a graph 400 illustrating a hold time analysis of conventional latch 100 at a VDD supply voltage of 0.890 Volts, process parameters 'tt' and a temperature of 125° C. Curve 401 represents required hold times associated with a falling input data signal D for various clock slew values, and curve 402 represents required hold times associated with a rising input data signal D for various clock slew values.

Figure 4B:
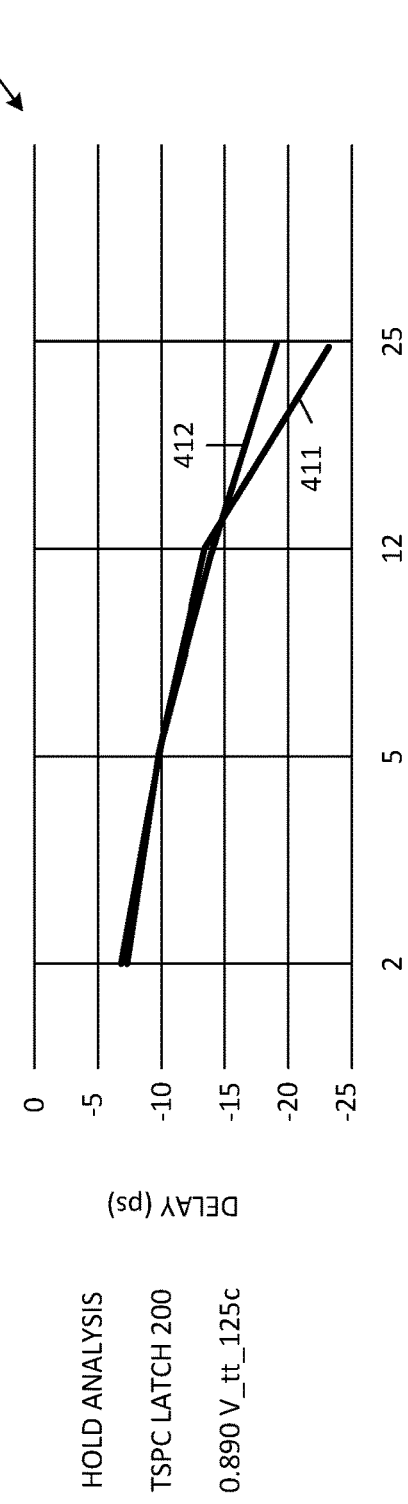
FIG. 4B is a graph illustrating a hold time analysis of the TSPC latch of FIG. 2 for an exemplary set of process parameters (tt), VDD supply voltage (0.890 Volts) and temperature (125° C.)

FIG. 4B is a graph 410 illustrating a hold time analysis of TSPC latch 200 at a VDD supply voltage of 0.890 Volts, process parameters 'tt' and a temperature of 125° C. Curve 411 represents required hold time associated with a falling input data signal D for various clock slew values, and curve 412 represents required hold times associated with a rising input data signal D for various clock slew values.

As illustrated by FIGS. 3A-3B and 4A-4B, the required hold times for TSPC latch 200 are less than the required hold times for the conventional latch 100, and the differences between the hold times required for rising and falling input data signals are advantageously significantly smaller for TSPC latch 200, due to the symmetrical input data paths for rising and falling input data signals. That is, the required hold time for rising input data signals is substantially the same as the required hold time for falling input data signals in TSPC latch 200, due to the symmetrical input data paths for rising and falling input data signals in this latch 200.

FIG. 5A is a graph 500 illustrating a setup time analysis of conventional latch 100 at a VDD supply voltage of 0.675 Volts, process parameters 'tt' and 'cw_ccw' (which represents a worst case parasitic capacitance netlist), and a temperature of 125° C. Curve 501 represents required setup times associated with a falling input data signal D for various clock slew values, and curve 502 represents required setup times associated with a rising input data signal D for various clock slew values.

FIG. 5B is a graph 510 illustrating a hold time analysis of TSPC latch 200 at a VDD supply voltage of 0.675 Volts, process parameters 'tt' and 'cw_ccw', and a temperature of 125° C. Curve 511 represents required setup times associated with a falling input data signal D for various clock slew values, and curve 512 represents required setup times associated with a rising input data signal D for various clock slew values.

Figure 6A:
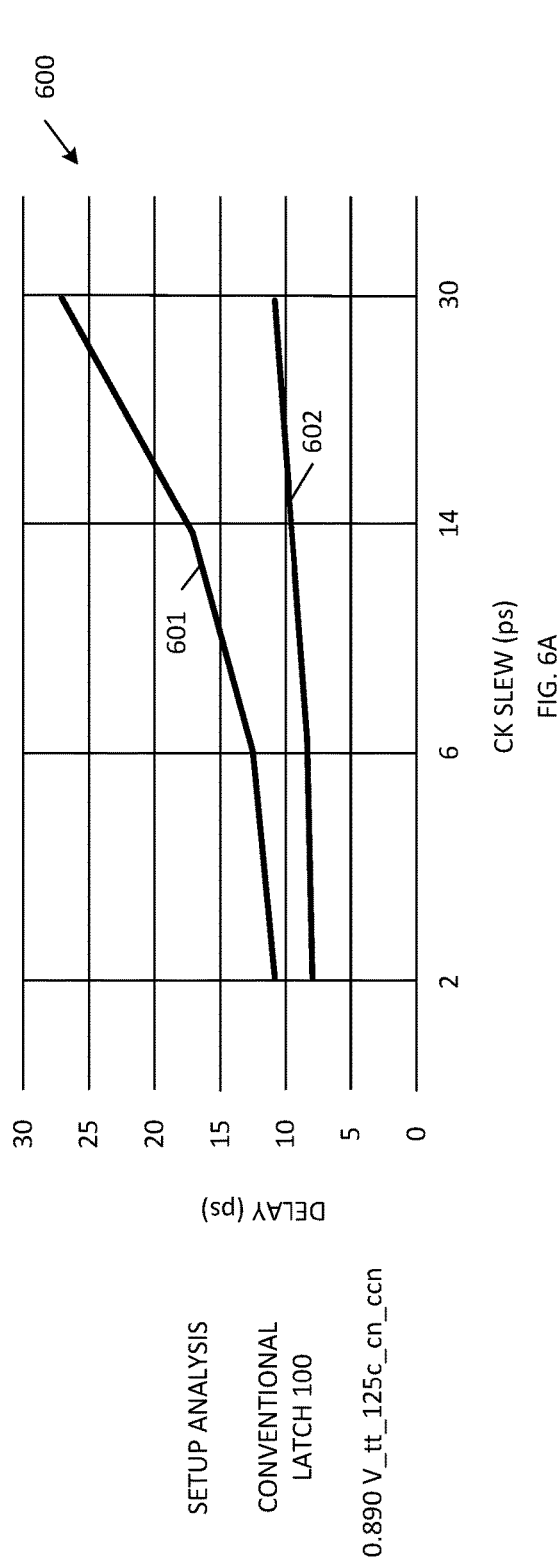
FIG. 6A is a graph illustrating a setup time analysis of the conventional latch of FIG. 1 for an exemplary set of process parameters (tt, cn_ccn), VDD supply voltage (0.890 Volts) and temperature (125° C.)

FIG. 6A is a graph 600 illustrating a setup time analysis of conventional latch 100 at a VDD supply voltage of 0.890 Volts, process parameters 'tt' and 'cn_ccn' (which represent a typical case parasitic capacitance netlist), and a temperature of 125° C. Curve 601 represents required setup times associated with a falling input data signal D for various clock slew values, and curve 602 represents required setup times associated with a rising input data signal D for various clock slew values.

Figure 6B:
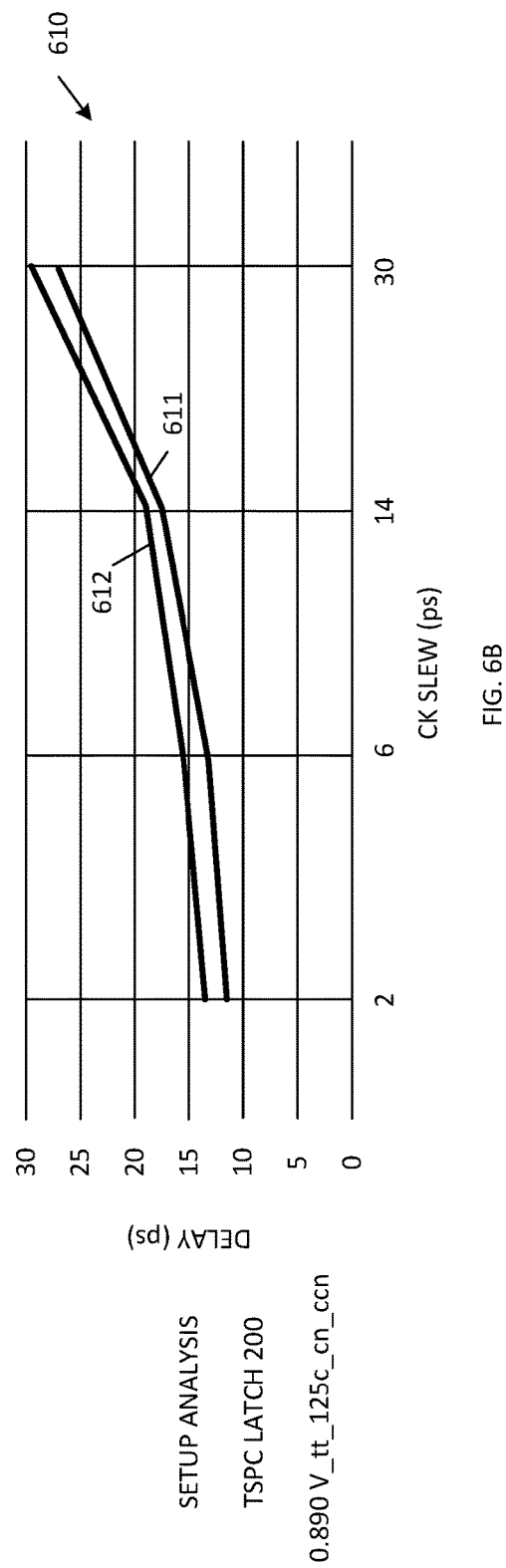
FIG. 6B is a graph illustrating a setup time analysis of the TSPC latch of FIG. 2 for an exemplary set of process parameters (tt, cn_ccn), VDD supply voltage (0.890 Volts) and temperature (125° C.)

FIG. 6B is a graph 610 illustrating a setup time analysis of TSPC latch 200 at a VDD supply voltage of 0.890 Volts, process parameters 'tt' and 'cn_ccn', and a temperature of 125° C. Curve 611 represents required setup times associated with a falling input data signal D for various clock slew values, and curve 612 represents required setup times associated with a rising input data signal D for various clock slew values.

As illustrated by FIGS. 5A-5B and 6A-6B, the required setup times for TSPC latch 200 are less than the required setup times for the conventional latch 100, and the differences between the setup times required for rising and falling input data signals are advantageously significantly smaller for TSPC latch 200. That is, the required setup time for rising input data signals is substantially the same as the required setup time for falling input data signals in TSPC latch 200, due to the symmetrical input data paths for rising and falling input data signals in this latch 200.

The elimination of the clock skew issue, in combination with the improved setup/hold times significantly improves the metastability (setup time+hold time) of the design of latch 200. FIGS. 7A-7F are graphs that show the improved metastability of TSPC latch 200, when compared with conventional latch 100, for various process, voltage and temperature variations.

Figure 7A:
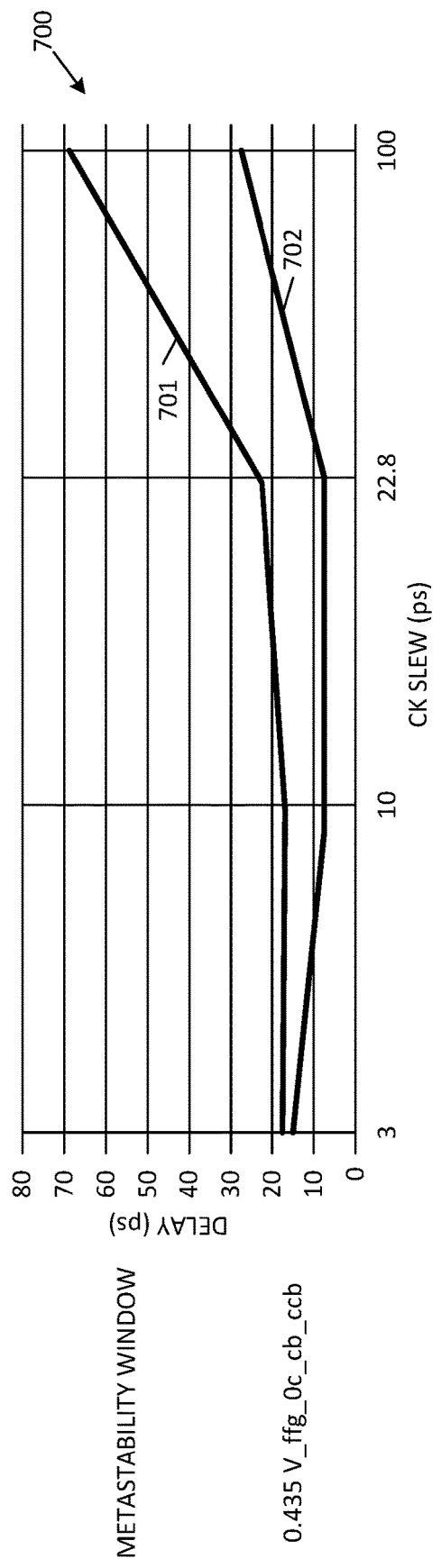
FIG. 7A is a graph of the metastability windows for the conventional latch of FIG. 1 and the TSPC latch of FIG. 2 for an exemplary set of process parameters (ffg, cb_ccb), VDD supply voltage (0.435 Volts) and temperature (0° C.)

More specifically, FIG. 7A is a graph 700 of the metastability windows (setup time+hold time) of conventional latch 100 and TSPC latch 200 at a VDD supply voltage of 0.435 Volts, process parameters 'ffg' (which represents a fast process with fast NMOS and PMOS transistors) and 'cb_ccb' (which represent a best case parasitic capacitance netlist), and a temperature of 0° C. Curve 701 represents the metastability of conventional latch 100 for various clock slew values, and curve 702 represents the metastability of TSPC latch 200 for various clock slew values.

Figure 7B:
FIG. 7B is a graph of the metastability windows for the conventional latch of FIG. 1 and the TSPC latch of FIG. 2 for an exemplary set of process parameters (tt, cw_ccw), VDD supply voltage (0.435 Volts) and temperature (0° C.)

FIG. 7B is a graph 710 of the metastability windows of conventional latch 100 and TSPC latch 200 at a VDD supply voltage of 0.435 Volts, process parameters 'tt' and 'cw_ccw', and a temperature of 0° C. Curve 711 represents the metastability of conventional latch 100 for various clock slew values, and curve 712 represents the metastability of TSPC latch 200 for various clock slew values.

Figure 7C:
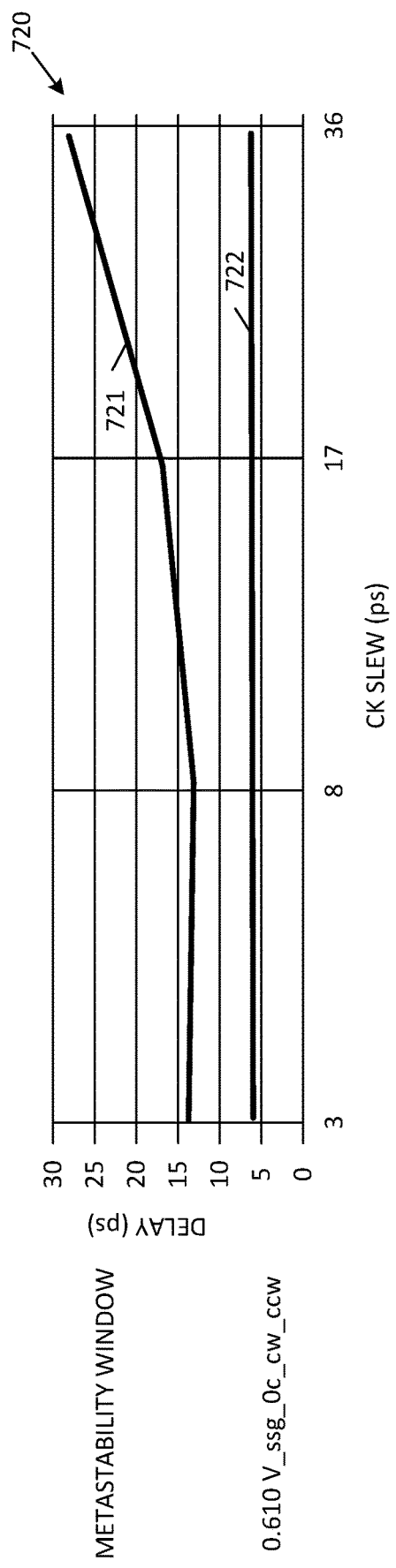
FIG. 7C is a graph of the metastability windows for the conventional latch of FIG. 1 and the TSPC latch of FIG. 2 for an exemplary set of process parameters (ssg, cw_ccw), VDD supply voltage (0.610 Volts) and temperature (0° C.).

FIG. 7C is a graph 720 of the metastability windows of conventional latch 100 and TSPC latch 200 at a VDD supply voltage of 0.610 Volts, process parameters 'ssg' (which represents a slow process with slow NMOS and PMOS transistors), and 'cw_ccw', and a temperature of 0° C. Curve 721 represents the metastability of conventional latch 100 for various clock slew values, and curve 722 represents the metastability of TSPC latch 200 for various clock slew values.

Figure 7D:
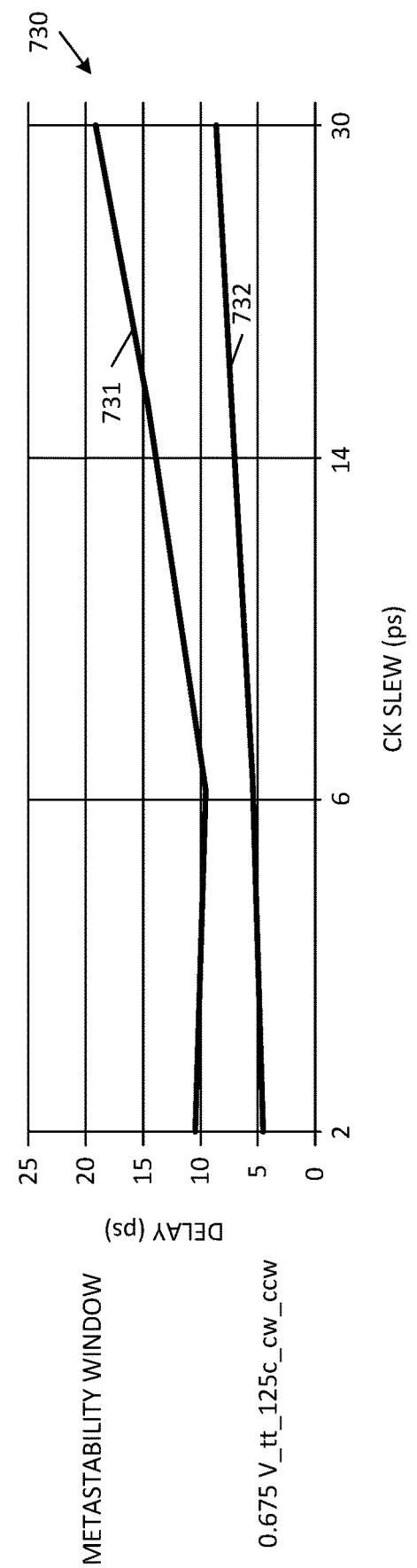
FIG. 7D is a graph of the metastability windows for the conventional latch of FIG. 1 and the TSPC latch of FIG. 2 for an exemplary set of process parameters (tt, cw_ccw), VDD supply voltage (0.675 Volts) and temperature (125° C.).

FIG. 7D is a graph 730 of the metastability windows of conventional latch 100 and TSPC latch 200 at a VDD supply voltage of 0.675 Volts, process parameters 'tt' and 'cw_ccw', and a temperature of 125° C. Curve 731 represents the metastability of conventional latch 100 for various clock slew values, and curve 732 represents the metastability of TSPC latch 200 for various clock slew values.

FIG. 7E is a graph 740 of the metastability windows of conventional latch 100 and TSPC latch 200 at a VDD supply voltage of 0.890 Volts, process parameters 'tt' and 'cn_ccn', and a temperature of 125° C. Curve 741 represents the metastability of conventional latch 100 for various clock slew values, and curve 742 represents the metastability of TSPC latch 200 for various clock slew values.

FIG. 7F is a graph 750 of the metastability windows of conventional latch 100 and TSPC latch 200 at a VDD supply voltage of 0.890 Volts, process parameters 'tt' and 'cw_ccw', and a temperature of 125° C. Curve 751 represents the metastability of conventional latch 100 for various clock slew values, and curve 752 represents the metastability of TSPC latch 200 for various clock slew values.

As illustrated by FIGS. 7A-7F, the metastability of TSPC latch 200 is significantly better than the metastability of conventional latch 100 over a wide range of process, voltage and temperature variations.

In addition, the required layout area of TSPC latch 200 is no more than the required layout area of conventional latch 100.

Technology Specific EDA System/Workflow Explanation

Figure 8:
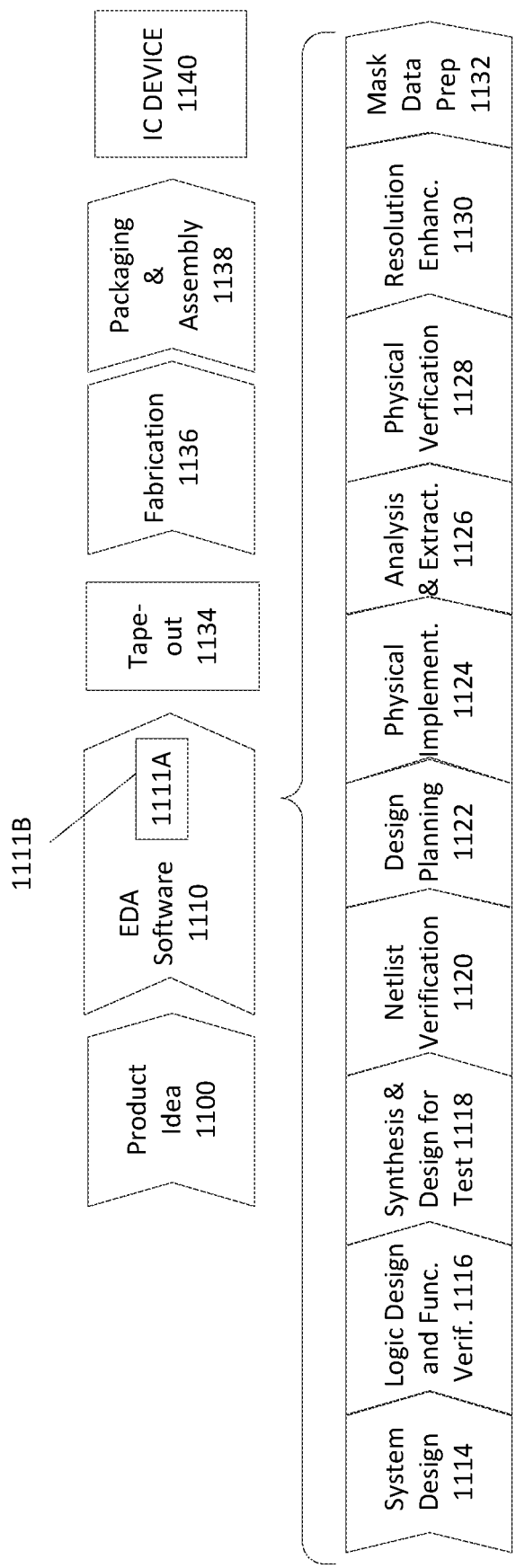
FIG. 8 is a flowchart illustrating various operations in the design and fabrication of an integrated circuit including the TSPC latch of FIG. 2 in accordance with an embodiment of the present disclosure.

FIG. 8 illustrates various processes performed in the design and fabrication of IC devices using EDA software tools with a computer to transform data and instructions that represent the associated IC devices. These processes start with the generation of a product idea (1100) with information supplied by one or more circuit designers. The product idea is realized as the evolving circuit design during the circuit design process performed by the circuit designer(s) using EDA software tools (1110). One or more steps of the EDA software design process performed by EDA software tools (1110) is implemented using a computer-readable medium 1111A that is read by a computer 1111B. EDA software tools may also be signified herein using the singular "EDA software tool", as EDA software, or as a design tool. When a circuit design is finalized, it is typically taped-out (1134), and then multiple ICs, each being a physical implementation of the final circuit design, are fabricated on a semiconductor wafer (160) using a selected technology node. The semiconductor wafer is then diced into individual chips, with each chip including one of the ICs, and then the chips are packaged and assembled using corresponding processes (1138), resulting in finished IC device 1140.

Note that the design process that uses EDA software tools (1110) includes operations 1114-1132, which are described below. This design flow description is for illustration purposes only and is not meant to limit the present disclosure. For example, an actual circuit design may require a circuit designer to perform the design operations in a different sequence than the sequence described herein. In accordance with one embodiment, the TSPC latch 200 of the present invention may be realized in connection with the EDA design process using various EDA software tools 1110.

During system design (1114), a circuit designer describes the functionality to be performed by the manufactured IC device. The designer can also perform what-if planning to refine the functionality and to check costs. Note that hardware-software architecture partitioning can occur at this stage. Exemplary EDA software products from Synopsys, Inc. of Mountain View, Calif. that can be used at this stage include: Model Architect, Saber, System Studio, and Designware products. Cells or other descriptions including all relevant information pertaining to the two-part USB PHY configuration of the present invention are typically copied from a library accessible by way of the EDA software tool, and inserted into a circuit design during the system design process.

Then, during logic design and functional verification (1116), VHDL or Verilog code for modules in the circuit is written and the design is checked for functional accuracy. More specifically, the design is checked to ensure that it produces the correct outputs. The VHDL or Verilog code is software comprising optimized readable program instructions adapted for the efficient description of a logic design. Exemplary EDA software products from Synopsys, Inc. of Mountain View, Calif. that can be used at this stage include: VCS, Vera, Designware, Magellan, Formality, ESP, PowerReplay and Leda products.

Next, during synthesis and design for test (1118), VHDL/Verilog code may be translated to a netlist. This netlist can be optimized for the target technology. Additionally, tests can be designed and implemented to check the finished integrated circuit. Exemplary EDA software products from Synopsys, Inc. of Mountain View, Calif. that can be used at this stage include: Design Compiler, Physical Compiler, Test Compiler, Power Compiler, FPGA Compiler, Tetramax, and Designware products.

Moreover, during netlist verification (1120), the netlist is checked for compliance with timing constraints and for correspondence with the VHDL/Verilog code. Exemplary EDA software products from Synopsys, Inc. of Mountain View, Calif. that can be used at this stage include: Formality, Primetime, and VCS products.

Furthermore, during design planning (1122), an overall floor plan for the integrated circuit is constructed and analyzed for timing and top-level routing. Exemplary EDA software products from Synopsys, Inc. of Mountain View, Calif. that can be used at this stage include: Astro and IC Compiler products.

Additionally, during physical implementation (1124), the placement (positioning of circuit elements such as transistors or capacitors) and routing (connection of the same by a plurality of conductors) occurs. Exemplary EDA software products from Synopsys, Inc. of Mountain View, Calif. that can be used at this stage include: the Astro and IC Compiler products.

Then, during analysis and extraction (1126), the circuit function is verified at a transistor level, which permits refinement of the logic design. Exemplary EDA software products from Synopsys, Inc. of Mountain View, Calif. that can be used at this stage include: Astrorail, Primerail, Primetime, and Star RC/XT products.

Next, during physical verification (1128), the design is checked to ensure correctness for manufacturing issues, electrical issues, lithographic issues, and circuitry. Exemplary EDA software products from Synopsys, Inc. of Mountain View, Calif. that can be used at this stage include the Hercules product.

Moreover, during resolution enhancement (1130), geometric manipulations of the layout are performed to improve manufacturability of the design. Exemplary EDA software products from Synopsys, Inc. of Mountain View, Calif. that can be used at this stage include: Proteus, Proteus, and PSMGED products.

Additionally, during mask-data preparation (1132), the 'tape-out' data for production of masks to produce finished integrated circuits is provided. Exemplary EDA software products from Synopsys, Inc. of Mountain View, Calif. that can be used at this stage include the Cats. family of products.

For all of the above-mentioned integrated circuit design tools, similar tools from other EDA vendors, such as Cadence and Mentor Graphics can be used as an alternative. Additionally, similarly non-commercial tools available from universities can be used.

Embodiments of the present disclosure can be used during one or more of the above-described stages. Specifically, some embodiments of the present disclosure can be used in EDA software 1110.

A storage subsystem is preferably used to store the basic programming and data constructs that provide the functionality of some or all of the EDA tools described herein, and tools applied for development of cells for the library and for physical and logical design using the library. These software modules are generally executed by one or more processors in a manner known to those of ordinary skill in the art.

The foregoing Detailed Description signifies in isolation individual features, structures or characteristics described herein and any combination of two or more such features, structures or characteristics, to the extent that such features, structures or characteristics or combinations thereof are based on the present specification as a whole in light of the knowledge of a person skilled in the art, irrespective of whether such features, structures or characteristics, or combinations thereof solve any problems disclosed herein, and without limitation to the scope of the claims. When an embodiment of a claimed invention comprises a particular feature, structure, or characteristic, it is within the knowledge of a person skilled in the art to use such feature, structure, or characteristic in connection with other embodiments whether or not explicitly described.

In view of the foregoing Detailed Description it will be evident to a person skilled in the art that many variations may be made within the scope of innovations, embodiments and/or examples, such as function and arrangement of elements, described herein without departing from the principles described herein. One or more elements of an embodiment may be substituted for one or more elements in another embodiment, as will be apparent to those skilled in the art. The embodiments described herein were chosen and described to signify the principles of the invention and its useful application, thereby enabling others skilled in the art to understand how various embodiments and variations are suited to the particular uses signified.

The foregoing Detailed Description of innovations, embodiments, and/or examples of the claimed inventions has been provided for the purposes of illustration and description. It is not intended to be exhaustive nor to limit the claimed inventions to the precise forms described, but is to be accorded the widest scope consistent with the principles and features disclosed herein. Obviously, many variations will be recognized by a person skilled in this art. Without limitation, any and all equivalents described, signified or incorporated by reference in this patent application are specifically incorporated by reference into the description herein of the innovations, embodiments and/or examples. In addition, any and all variations described, signified or incorporated by reference herein with respect to any one embodiment are also to be considered taught with respect to all other embodiments. Any such variations include both currently known variations as well as future variations, for example any element used herein includes a future equivalent element that provides the same function, regardless of the structure of the future equivalent.

It is intended that the scope of the claimed inventions be defined and judged by the following claims and equivalents. The following claims are hereby incorporated into the Detailed Description, with each claim standing on its own as a separate embodiment. Disclosed embodiments can be described with more features than are expressly recited in the claims.

The previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

We claim:

1. An electronic structure for implementing a True Single Phase Clock (TSPC) latch design, the electronic structure comprising:
   a data input circuit that includes symmetrical input data paths, including a first input data path for a rising input data signal and a second input data path for a falling input data signal, wherein the first input data path includes:
      a first NMOS transistor that couples a first node to receive a first supply voltage in response to the rising input data signal, and
      a first PMOS transistor and a second PMOS transistor coupled in series between a second voltage supply terminal and a data input node, wherein the first PMOS transistor is turned on in response to the first supply voltage on the first node and the second PMOS transistor is turned on in response to an input clock signal, thereby applying a second supply voltage from the second voltage supply terminal to the data input node,
   and wherein the second data path includes:
      a third PMOS transistor and a fourth PMOS transistor coupled in series between the second voltage supply terminal and the first node, wherein the third PMOS transistor is turned on in response to the falling input data signal, and the fourth PMOS transistor is turned on in response to the input clock signal, thereby applying the second supply voltage to the first node, and
      a second NMOS transistor that couples the first supply voltage to the data input node in response to the second supply voltage on the first node,
   wherein the input data circuit further includes a third NMOS transistor coupled between the first node and the first voltage supply terminal, wherein the third NMOS transistor has a gate coupled to receive the input clock signal.

2. The electronic circuit of claim 1, further comprising a data latch circuit including a feedback inverter that is enabled and disabled in response to the input clock signal and a voltage on the first node.

3. The electronic circuit of claim 2, wherein the data latch circuit further comprises a feed-forward inverter coupled to the feedback inverter.

4. The electronic circuit of claim 3, further comprising an output inverter coupled to the data latch circuit, wherein the input data circuit, data latch circuit and output inverter form a TSPC latch.

5. The electronic circuit of claim 4, wherein the feedback inverter includes a fourth NMOS transistor having a gate coupled to receive the input clock signal, wherein the second PMOS transistor, the fourth PMOS transistor, the third NMOS transistor and the fourth NMOS transistor are the only transistors of the TSPC latch having gates coupled to receive the input clock signal.

6. The electronic circuit of claim 2, wherein the feedback inverter comprises:
   a fifth PMOS transistor having a gate coupled to the first node; and
   a fourth NMOS transistor having a gate that receives the input clock signal.

7. The electronic circuit of claim 6, wherein the feedback inverter further comprises:
   a sixth PMOS transistor, wherein the fifth and sixth PMOS transistors are coupled in series between the second voltage supply terminal and the data input node; and
   a fifth NMOS transistor, wherein the fourth and fifth NMOS transistors are coupled in series between the data input node and the first voltage supply terminal, wherein a gate of the sixth PMOS transistor and a gate of the fifth NMOS transistor are commonly coupled to form an input terminal of the feedback inverter.

8. The electronic circuit of claim 7, wherein the data latch circuit further comprises a feed-forward inverter having an input terminal coupled to the data input node and an output terminal coupled to the input terminal of the feedback inverter.

9. An electronic structure having a data input circuit comprising:
   a first input data path comprising a first PMOS transistor and a second PMOS transistor coupled in series between a first voltage supply terminal and a first node, and a first NMOS transistor coupled between a second node and a second voltage supply terminal, wherein the first NMOS transistor has a gate coupled to the first node, the first PMOS transistor has a gate that receives an input data signal, and the second PMOS transistor has a gate that receives an input clock signal;
   a second input data path comprising a third PMOS transistor and a fourth PMOS transistor coupled in series between the first voltage supply terminal and the second node, and a second NMOS transistor coupled between the first node and the second voltage supply terminal, wherein the first NMOS transistor has a gate that receives the input data signal, the third PMOS transistor has a gate coupled to the first node and the fourth PMOS transistor has a gate that receives the input clock signal; and
- a third NMOS transistor coupled between the first node and the second voltage supply terminal, wherein the third NMOS transistor has a gate coupled to receive the input clock signal.

10. The electronic structure of claim 9, further comprising a data latch circuit coupled to the second node, wherein the data latch circuit is enabled in response to the input clock signal and a voltage on the first node.

11. The electronic structure of claim 10, wherein the data latch circuit includes a feedback inverter comprising:
- a fifth PMOS transistor, a sixth PMOS transistor, a fourth NMOS transistor and a fifth NMOS transistor coupled in series between the first voltage supply terminal and the second voltage supply terminal, wherein the fifth PMOS transistor has a gate coupled to the first node, and the fifth NMOS transistor has a gate that receives the input clock signal.

12. The electronic structure of claim 11, wherein the data latch circuit includes a feed-forward inverter coupled to the feedback inverter.

13. The electronic structure of claim 12, further comprising an output inverter coupled to the data latch circuit.

\* \* \* \* \*